(12) United States Patent
Bauer

(10) Patent No.: US 7,050,287 B2
(45) Date of Patent: May 23, 2006

(54) SIGN BALLAST CAPACITOR ASSEMBLY

(75) Inventor: Stacey G Bauer, Ogallala, NE (US)

(73) Assignee: American Shizuki Corporation (ASC Capacitors), Ogallala, NE (US)

(*) Notice: Subject to any disclaimer, the term of this patent is extended or adjusted under 35 U.S.C. 154(b) by 0 days.

(21) Appl. No.: 10/938,131

(22) Filed: Sep. 10, 2004

(65) Prior Publication Data

US 2006/0056133 A1    Mar. 16, 2006

(51) Int. Cl.
*H01G 4/00*    (2006.01)

(52) U.S. Cl. ............... 361/301.3; 361/328; 361/763; 29/25.41

(58) Field of Classification Search ............ 361/301.3, 361/301.5, 328, 511, 517–519, 535–537, 361/528–530, 752, 760–764, 802, 814, 758, 361/514; 29/25.41, 25.42
See application file for complete search history.

(56) References Cited

U.S. PATENT DOCUMENTS

| | | | |
|---|---|---|---|
| 3,644,780 A | | 2/1972 | Koyama et al. |
| 3,787,751 A | | 1/1974 | Farrow |
| 4,185,233 A | | 1/1980 | Riesland et al. |
| 4,527,098 A | * | 7/1985 | Owen .................. 315/290 |
| 4,791,529 A | | 12/1988 | Duncan et al. |
| 4,862,039 A | | 8/1989 | Kile et al. |
| 4,972,126 A | | 11/1990 | Nilssen |
| 5,019,749 A | | 5/1991 | Ito |
| 5,019,948 A | * | 5/1991 | Steketee et al. ............ 361/802 |
| 5,068,574 A | | 11/1991 | Koda et al. |
| 5,309,066 A | | 5/1994 | Ditlevsen |
| 5,323,295 A | * | 6/1994 | Pines .................. 361/709 |
| 5,387,849 A | | 2/1995 | Sridharan |
| 5,620,476 A | * | 4/1997 | Truex et al. ............... 607/36 |
| 5,742,497 A | | 4/1998 | Hashimoto et al. |
| 5,789,871 A | | 8/1998 | Shen et al. |
| 5,977,723 A | | 11/1999 | Yoon |
| 6,111,365 A | | 8/2000 | Mirskiy et al. |
| 6,184,630 B1 | | 2/2001 | Qian et al. |
| 6,198,619 B1 | * | 3/2001 | Fujioka .................. 361/328 |
| 6,509,696 B1 | | 1/2003 | Bruning et al. |

OTHER PUBLICATIONS

*A Primer on Power Factor Correction*, EC&M Web Site, pp. 1-7, www.ecmweb.com/mag/electric, printed Aug. 2, 2004.

* cited by examiner

Primary Examiner—Anthony Dinkins
(74) Attorney, Agent, or Firm—Merchant & Gould P.C.

(57) ABSTRACT

A high voltage sign ballast capacitor assembly is disclosed. The assembly includes two components for the sign ballast operation, namely a main capacitor element for power factor correction and up to six starting capacitors for aiding in starting under cold weather conditions. The main capacitor element is arranged and configured to divide the necessary capacitance into several capacitors connected in series. By doing so, the voltage is divided across each of the series capacitors resulting in reduced voltage stress and a reduction in the risk of corona arcing. The assembly is preferably constructed as a modular printed circuit board and a sleeve that houses the circuit board. The circuit board allows for the incorporation of multiple lead configurations, multiple start capacitors, and bleed resistors.

25 Claims, 8 Drawing Sheets

US 7,050,287 B2

SIGN BALLAST CAPACITOR ASSEMBLY

FIELD OF THE INVENTION

This invention relates generally sign ballast capacitors; and more particularly to a method and apparatus for connecting dry capacitors in series in a high voltage ballast application in order to decrease the voltage stress across the individual capacitors.

BACKGROUND

Fluorescent lamps are widely used due to their relatively low power consumption and high light output. The lamps are used in a variety of applications and in a variety of environments. In an office environment, the input voltages are typically 120–240 volts alternating current (VAC). Ballasts for fluorescent lamps typically include a power factor correction capacitor. In the case of these lower voltage applications, the capacitor can be made from a single section of metallized film.

However, in higher power applications, such as in the fluorescent and neon sign environments, there are different considerations that lead to different components being used. For example, due to the size of the signs and length of the fluorescent and neon tubes, higher voltages are required to excite the lamp gases. These voltages start in the range of 460 VAC and can be as high as 1320 VAC. The increased voltages are accomplished via step up transformers. The signs may also be located in colder temperature environments in which additional starter capacitors are required. In these high voltage applications, oil filled capacitors were generally utilized in the prior art as the power factor correction capacitors. Dry capacitors were not used because the higher voltages lead to operation of the dry capacitor in a corona manner (e.g., lead to an arcing between the capacitor plates). Therefore, oil filled capacitors were employed to reduce and/or eliminate this arcing due to the insulating properties of the oil located between the plates. However, oil filled capacitors have several drawbacks relative to dry capacitors. For example, the size of oil filled capacitors is generally limited due to fixed can sizes. The size limitation also then limits the size of the cover assembly and the distance that can be employed between the connection terminals on the cover assembly. As a consequence, the number of start capacitors is also then limited. Still further, oil filled capacitors are more costly than dry capacitors.

Therefore, there is a need in the art for a dry capacitor assembly in a higher voltage fluorescent and neon light environment without the drawback of corona arcing. Such dry capacitors can be manufactured as a wound capacitor for providing multiple capacitances in series within the single capacitor. The present invention also overcomes other shortcomings of the prior art and addresses these needs in the art.

SUMMARY

A preferred embodiment of an apparatus constructed according to the principles of the present invention forms a high voltage sign ballast capacitor assembly. The assembly includes two components for the sign ballast operation. These components are the main capacitor element for power factor correction and up to six starting capacitors for aiding in starting under cold weather conditions. The main capacitor element is arranged and configured to divide the necessary capacitance into several capacitors connected in series. By doing so, the voltage is divided across each of the series capacitors. Stated a different way, by connecting several capacitances in series, the resulting voltage stress across the several capacitances is lower than if a single capacitance is utilized. By constructing the assembly in this manner, dry capacitors may be employed since the risk of corona arcing is lowered (e.g., because the voltage drop across the capacitor is lowered).

The assembly is preferably constructed as a modular printed circuit board and a sleeve that houses the circuit board. The sleeve is arranged and configured to act as a protective enclosure for the printed circuit board, while at the same time allowing the circuit board to readily slide in and out of the sleeve. This method of construction allows for ease of assembly, repair and replacement, upgrading of the board, and field testing components.

The circuit board includes two or more capacitors to correct the power factor of the sign ballast and may optionally include one or more start capacitors to help start the fluorescent light in cold temperatures. Additionally, the circuit board allows for the incorporation of multiple lead configurations, multiple start capacitors, and bleed resistors.

More specifically, the circuit board assembly preferably comprises a single circuit board that includes the main capacitors for power factor correction and may also include the start capacitors for situations when they are necessary. The circuit board assembly utilizes dry capacitors, as opposed to oil filled capacitors, to correct the power factor and can accommodate voltages up to the kilovolt range without suffering from corona discharge. The ability to handle such high voltages with dry capacitors is accomplished by connecting the dry capacitors in series to divide the voltage across any one of the capacitors. Furthermore, a single capacitor may be wound of series metalized film (i.e., multiple metalized sections) to provide multiple capacitances in series within the single discrete capacitor device. These multiple capacitances further divide the voltage.

By way of example, two capacitors may be mechanically wired in series on the board, which each capacitor having two capacitant sections, such as for use in a 1320 VAC application. Accordingly, since there are now the equivalent of four capacitors, each section of each capacitor experiences only 330 VAC. This voltage is low enough to avoid corona discharge given a dry dielectric of reasonable thickness.

Another feature of the present invention is the inclusion of bleed resistors located on the printed circuit board. The resistors are preferably connected in parallel with the power correction capacitors, and the optional starting capacitors, to bleed down the voltage across the capacitors in a determined period of time after the power is removed from the circuit board assembly.

Yet another feature of the present invention is that by utilizing a board assembly, the component count may be lowered. This results in manufacturing and replacement part efficiencies. Additionally, the board assembly offers a more modular design optimized for the production line.

Therefore, according to one aspect of the present invention, there is provided a sign ballast capacitor apparatus, comprising: a first dry capacitor, and a second dry capacitor, the second dry capacitor electrically connected in series with the first dry capacitor, wherein the first and second capacitor divide the voltage across the first and second capacitors, whereby the voltage stress is lowered.

According to another aspect of the invention, there is provided a capacitor ballast assembly, comprising: a printed circuit board having a voltage input terminal and a common connection terminal; a plurality of dry capacitors connected in series with one another, wherein the plurality of dry capacitors form the power factor correction capacitance of the ballast; and wherein when a voltage is applied to the input terminal, the voltage associated with each of the plurality of dry capacitors is divided across the individual dry capacitors.

According to yet another aspect of the invention, there is provided, a method of forming a capacitor ballast assembly, comprising: providing a printed circuit board with a voltage input terminal and a common connection terminal; connecting a plurality of dry capacitors in series with one another, wherein the plurality of dry capacitors form the power factor correction capacitance of the ballast, wherein when a voltage is applied to the input terminal, the voltage associated with each of the plurality of dry capacitors is divided across the individual dry capacitors; inserting the plurality of dry capacitors into vinyl sleeves; and inserting the printed circuit board into a protective sleeve.

While the invention will be described with respect to preferred embodiment configurations and with respect to particular devices used therein, it will be understood that the invention is not to be construed as limited in any manner by either such configuration or components described herein. Also, while the particular types of dry capacitors are described herein, it will be understood that such particular dry capacitors are not to be construed in a limiting manner. Instead, the principles of this invention extend to any ballast environment in which a plurality of capacitors are connected in series to provide a divided, lowered voltage drop across the plurality of capacitors. Further, while the preferred embodiments of the invention will be generally described in relation to use in a fluorescent or neon sign environment, it will be understood that the scope of the invention is not to be so limited. These and other variations of the invention will become apparent to those skilled in the art upon a more detailed description of the invention.

The advantages and features which characterize the invention are pointed out with particularity in the claims annexed hereto and forming a part hereof. For a better understanding of the invention, however, reference should be had to the drawings which form a part hereof and to the accompanying descriptive matter, in which there is illustrated and described a preferred embodiment of the invention.

BRIEF DESCRIPTION OF THE DRAWINGS

Referring to the drawings, wherein like numerals represent like parts throughout the several views.

DETAILED DESCRIPTION

The principles of the present invention apply particularly well to its application in a high voltage fluorescent or neon sign ballast assembly. However, other environments in which a high voltage drop is utilized across an oil filled capacitor may also employ the principles of this invention. For example, the present invention may be employed in motor applications. As used herein, the term, high voltage, will refer to voltages higher than 360 VAC and preferably higher than 540 VAC.

The principles of this invention are directed to using main capacitor elements in series to divide the voltage over the elements. By doing so, the voltage is divided across each of the series capacitors and the voltage stress is lowered. By connecting several capacitances in series, the resulting voltage stress across the several capacitances is lower than if a single capacitance is utilized. By constructing the assembly in this manner, dry capacitors may be employed since the risk of corona arcing in an alternating current environment is lowered (e.g., because the voltage stress across the capacitor is lowered). The main capacitor elements are of the type used for power correction. Preferably, the main capacitor elements include one or two capacitors wound with single or multiple section material to provide for corona relief. The capacitor elements are electrically connected in series with one another.

Figure 1A:
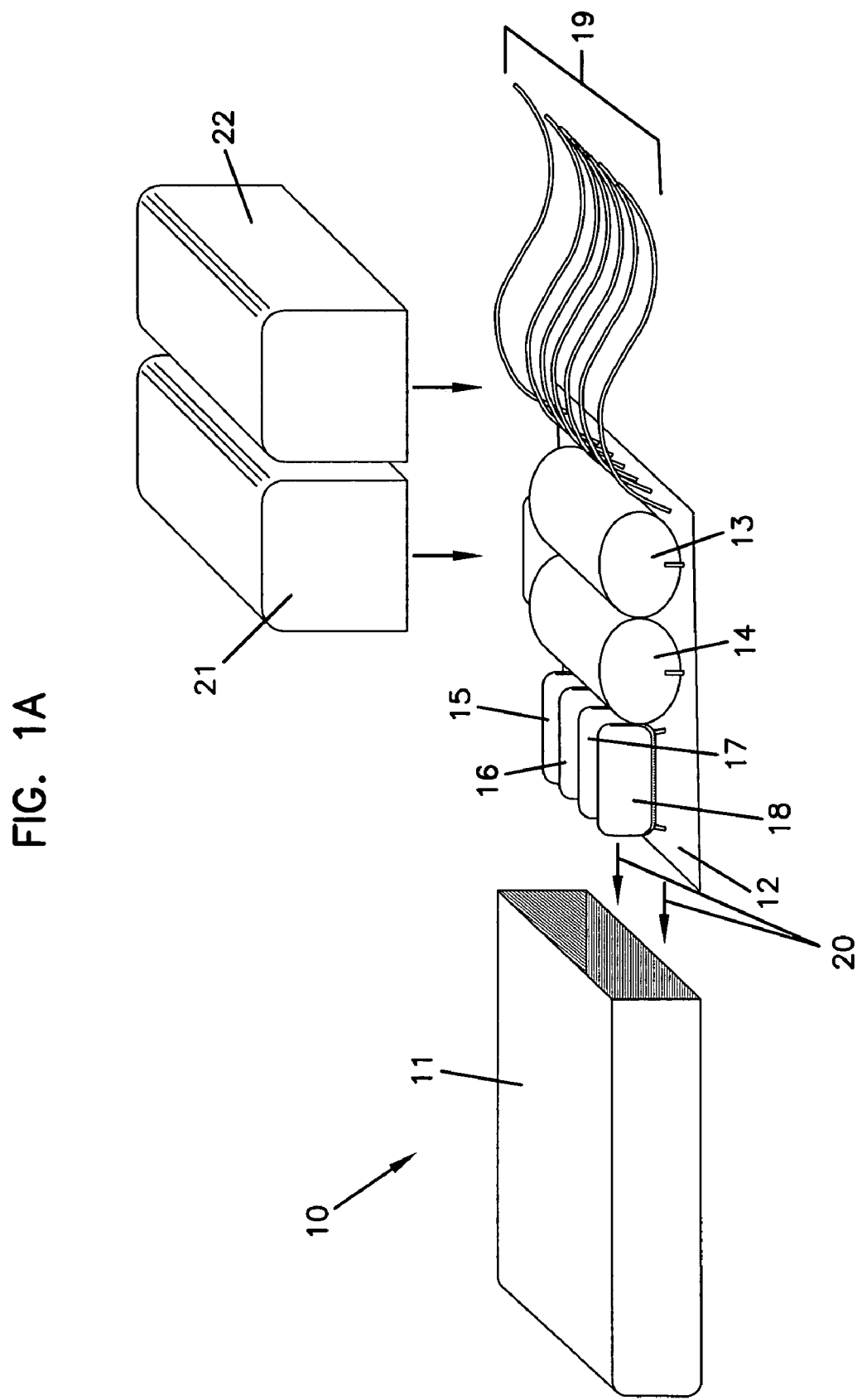
FIG. 1a is a schematic perspective drawing of the sign ballast capacitor assembly constructed in accordance with the principles of the present invention in which the circuit board 12 (and components mounted thereon) have not yet been inserted into sleeve 11.
Figure 1B:
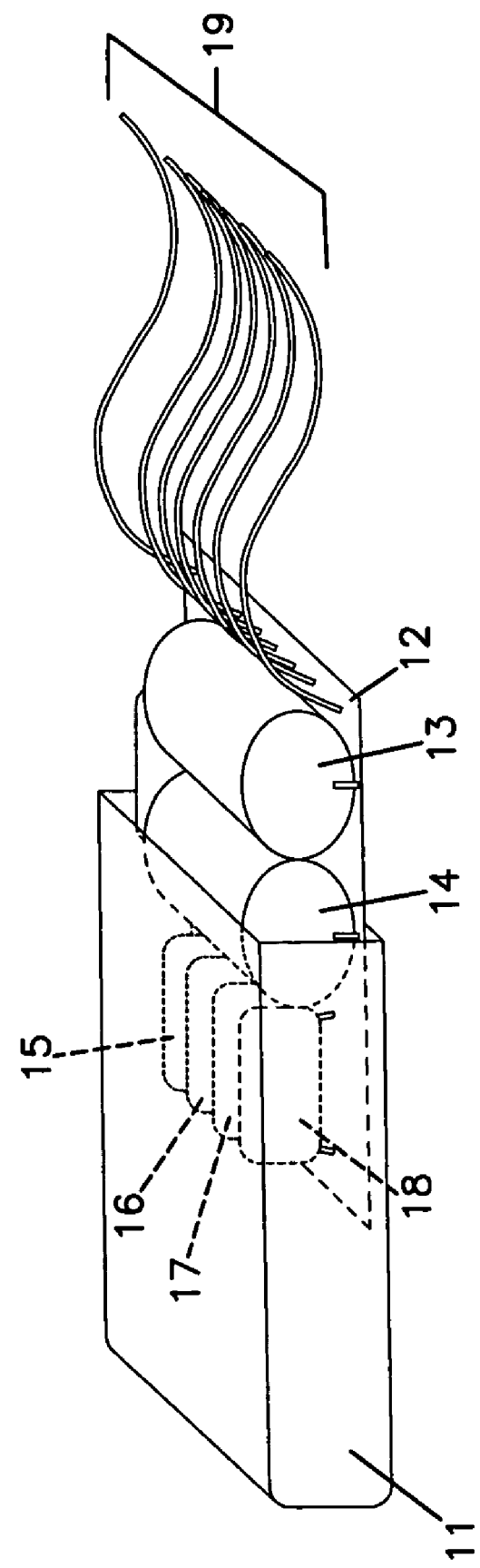
FIG. 1b is a schematic perspective drawing of the sign ballast capacitor assembly of FIG. 1a in which the printed circuit board 12 (and components mounted thereon) have been partially inserted into the sleeve 11 (wherein the inserted components are shown in phantom).

In a preferred embodiment constructed in accordance with the principles of the present invention, there is provided a sign ballast capacitor assembly designated generally at 10 in FIGS. 1a and 1b. The sign (not shown) preferably includes neon or fluorescent lights. However, the sign may include other types of lights in addition to lighting in which the gases are excited with a high voltage.

The assembly 10 is comprised of a printed circuit board 12, on which various discrete electrical components are mounted (e.g., capacitors and resistors among other electrical components), a protective sleeve 11, and protective vinyl sleeves 21 and 22. The printed circuit board, with the components mounted thereon, is arranged and configured to be slideably received into sleeve 11. FIG. 1a illustrates the printed circuit board 12 with components mounted thereon prior to being inserted into sleeve 11. Arrows 20 illustrate the direction of travel to insert the printed circuit board 12. FIG. 1b illustrates printed circuit board 12 partially inserted into sleeve 11, wherein the components located on circuit board 12 which are within sleeve 11 are shown in phantom.

Vinyl sleeves 21 and 22 may also optionally be employed to cover capacitors 13 and 14. Vinyl sleeves 21 and 22 function to reduce/eliminate potential arc-overs and to help thermally protect the capacitors 13 and 14 if hot tar/pitch is utilized to protect the devices mounted on printed circuit board 12.

It will be appreciated that while sleeve 11 and vinyl sleeves 21 and 22 are utilized in connection with the preferred embodiment, such sleeve(s) is optional. Further, it will be appreciated that while the electrical components are described herein as being mounted on the printed circuit board 12, that mounting includes electrically connecting the devices to one another so as to operate in their intended manner. This includes stuffing the devices, as that term is known in the art, on the board and connecting the devices to one another with appropriate electrically conductive, metal traces. Other soldering techniques, wiring, crimping and other electrical connections may also be employed.

As noted above, the printed circuit board 12 includes several discrete components including: first wound capacitor 13, second wound capacitor 14, and cold start capacitors 15, 16, 17, and 18. The leads from the various capacitors through the printed circuit board 12 to the electrical connection traces on the back (best seen in FIG. 3 below) of the printed circuit board 12 are also illustrated. Electrical connection leads 19 are shown to illustrate the preferred manner in which the components mounted on the printed circuit board 12 are connected to the other electrical portions of the ballast (not shown). The terminal configuration utilized may take any number of forms including quick disconnects, wires, solder lugs, and/or solder holes. Other types and styles of leads and connectors might also be employed.

Figure 2:
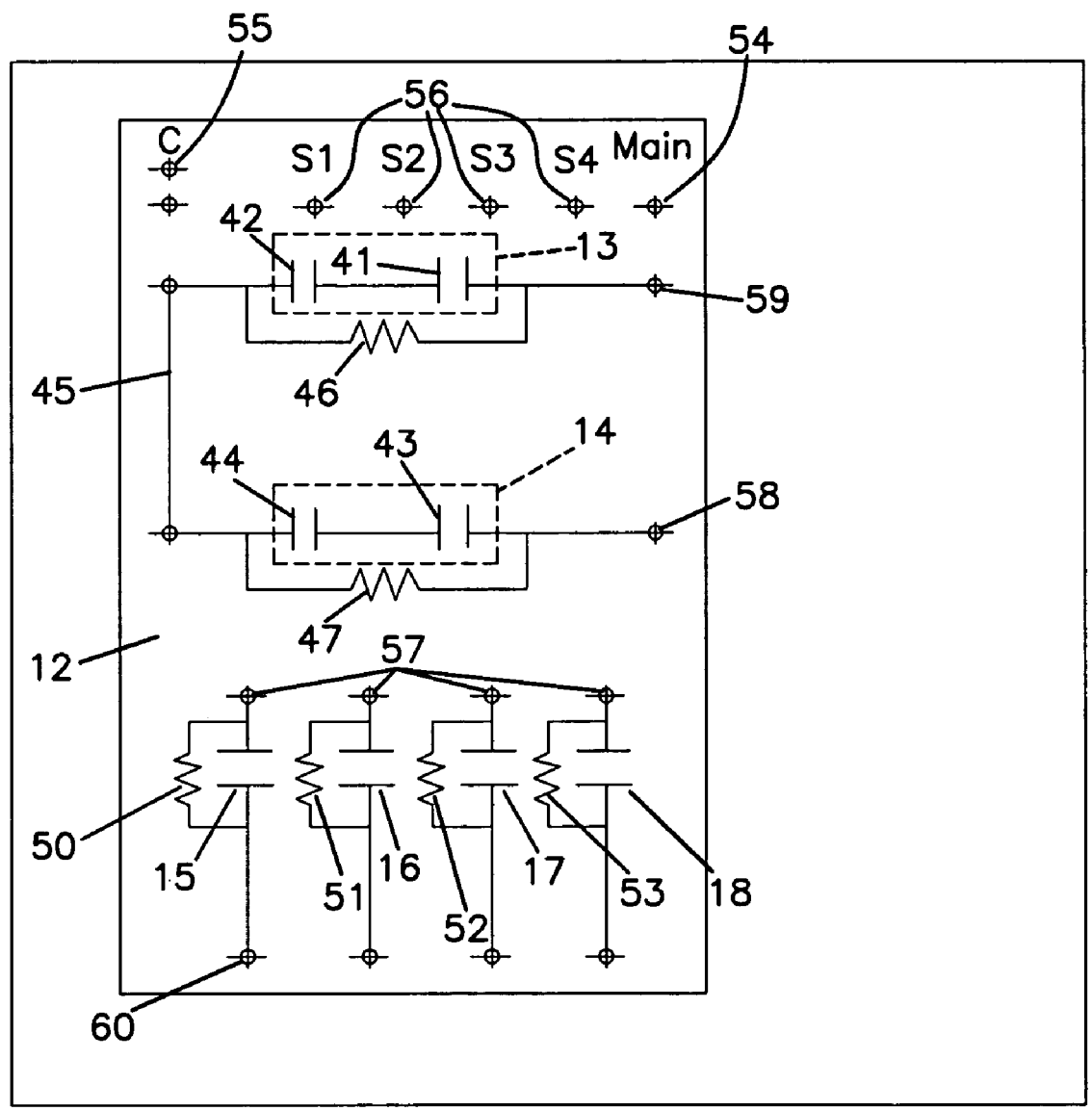
FIG. 2 is a schematic circuit diagram for the circuit board 12.

Turning now to FIG. 2, the electrical schematic of the components for the sign ballast capacitor assembly 10 are illustrated. Wound capacitor 13 may be comprised of two capacitors 41 and 42. In parallel with wound capacitor 13 is bleed resistor 46. This resistor is added to bleed the first wound capacitor 13 voltage down to 50 volts in approximately one minute (or preferably in one minute or less). Second wound capacitor 14 may be comprised of two capacitors 43 and 44. Bleed resistor 47 is mounted and connected in parallel to the second wound capacitor 14. The first wound capacitor 13 and second wound capacitor 14 are electrically connected in series via trace 45 located on the printed circuit board 12.

Optional cold starting capacitors 15, 16, 17, and 18 may be mounted as necessary for the application on the printed circuit board 12. Bleed resistors 50, 51, 52, and 53 connected in parallel with associated starting capacitors 15, 16, 17 and 18, respectively. A plurality of the lead connectors 19 are electrically connected via connectors 56 to the respective starting capacitors, while two of the connectors 19 are associated with the main power connection 54 and common connection 55. The main power connection 54 is connected to the first end of series capacitors 13 and 14 at connector 59. The second end (or low end) of series capacitors 13 and 14 is connected to connection point 58.

Figure 3:
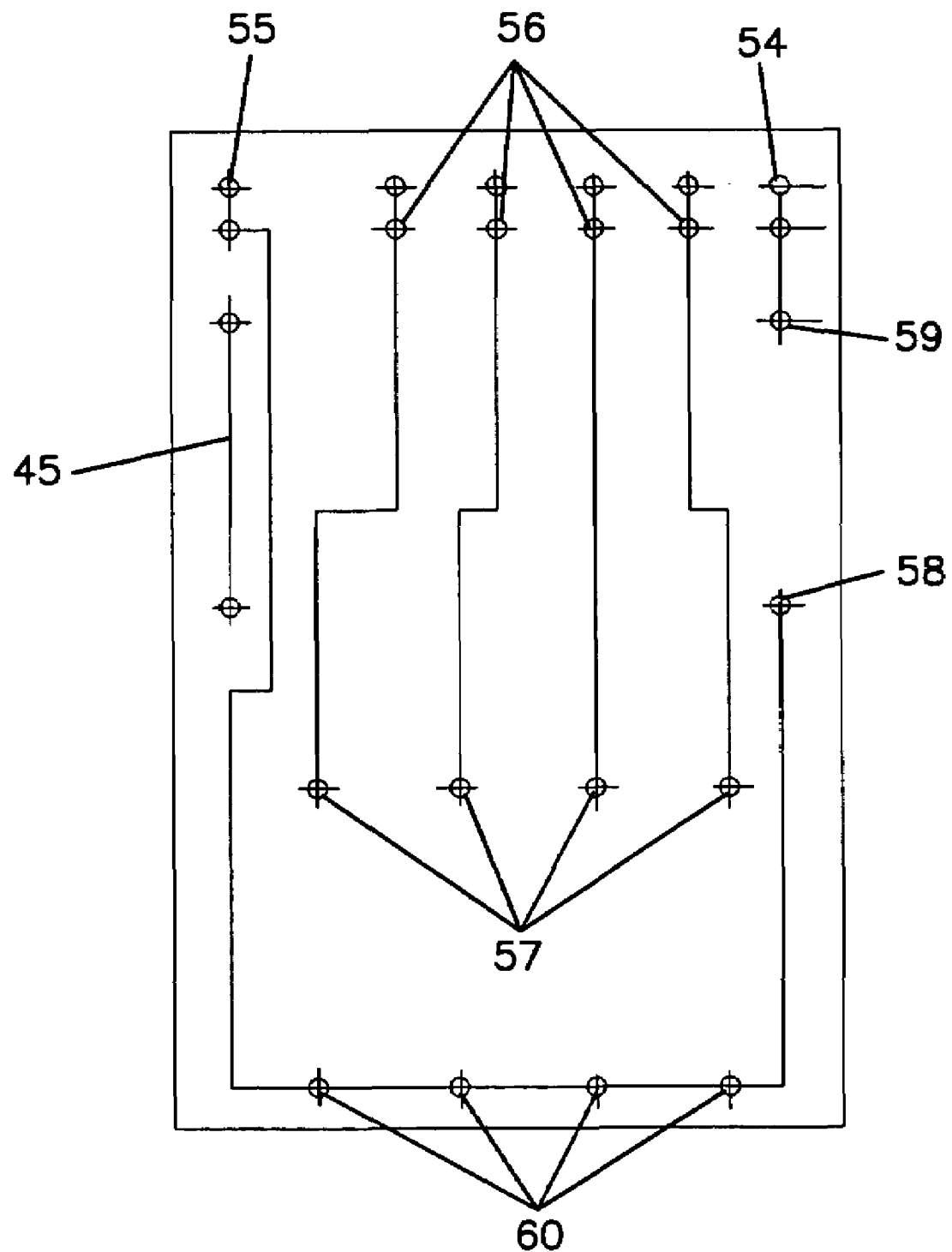
FIG. 3 is a schematic diagram illustrating the trace connections of the circuit board 12 of FIG. 2.

As shown in FIGS. 2 and 3, low end connection points 58 and 60 are connected to common connection 55 via electrical traces. Input connections 56 are connected to the starting capacitors 15–18 respectively at electrical connection points 57. As noted above, the main power connection 54 is connected to series capacitors 13 and 14 at connection point 59 thru the first series wound capacitor 13, thru trace 45, across second series wound capacitor 14, and finally to the connection point 58.

Figure 4:
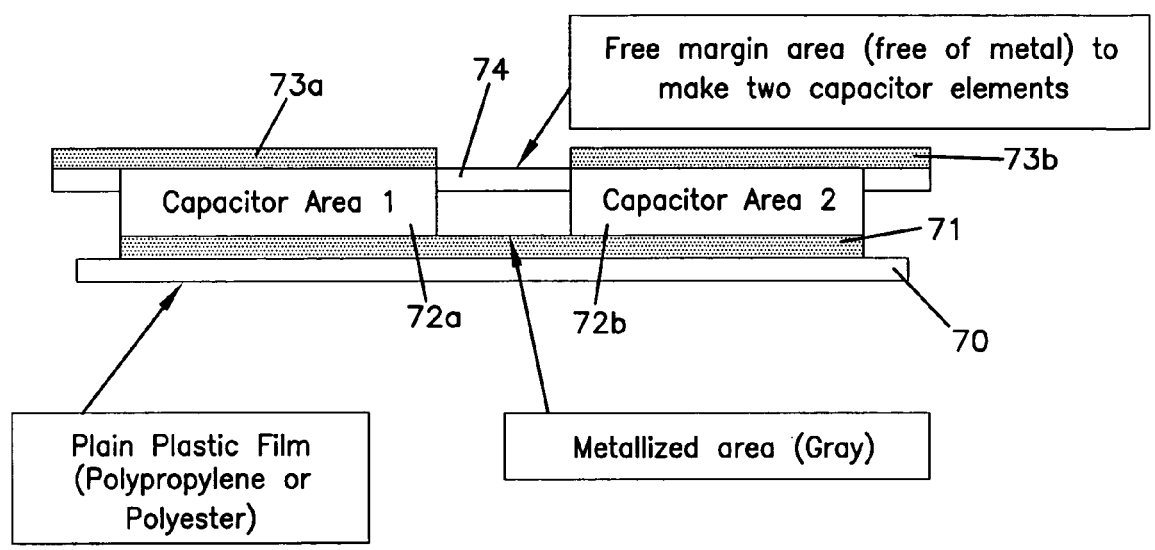
FIG. 4 is an elevated plan view of a two section metalized film layout for a wound dry capacitor (prior to winding).

Turning now to FIG. 4, for voltages above 660 VAC, the series wound capacitors 13 and 14 may include two capacitive elements in each of the series wound capacitors. For parts with ratings between 400–660 VAC, single section windings may be used. It may also be useful in some instances to include two capacitive elements in one of the series capacitors and a single capacitive element in the second series capacitors. Table I is presented below indicating the physical layout of the preferred series capacitors. In any of the configurations, however, the first 13 and second 14 capacitors are connected in series to provide a divided voltage across the series wound capacitors 13 and 14.

The following Table I includes the prefered voltages and number of series capacitors to be employed. In these cases, the capacitances of the series capacitors are in the range of 0.4 microFarad to 5.4 microFarads. The capacitors are physically 1 and ½ inches in length to 2 and ½ inches in length, and have a ¾ to 2 inch diameter. It will be appreciated that such physical dimensions and capacitances are examples of the preferred embodiment and that other dimensions and capacitances might be employed.

TABLE I

| VOLTAGE RANGE | SECTIONS | PHYSICAL LAYOUT |
| --- | --- | --- |
| 360 V to 660 V | 2 | Two 1-section windings in series |
| 661 V to 750 V | 3 | One 1-section winding and one 2-section winding in series |
| 750 V to 1320 V | 4 | Two 2-section windings in series |

Figure 5:
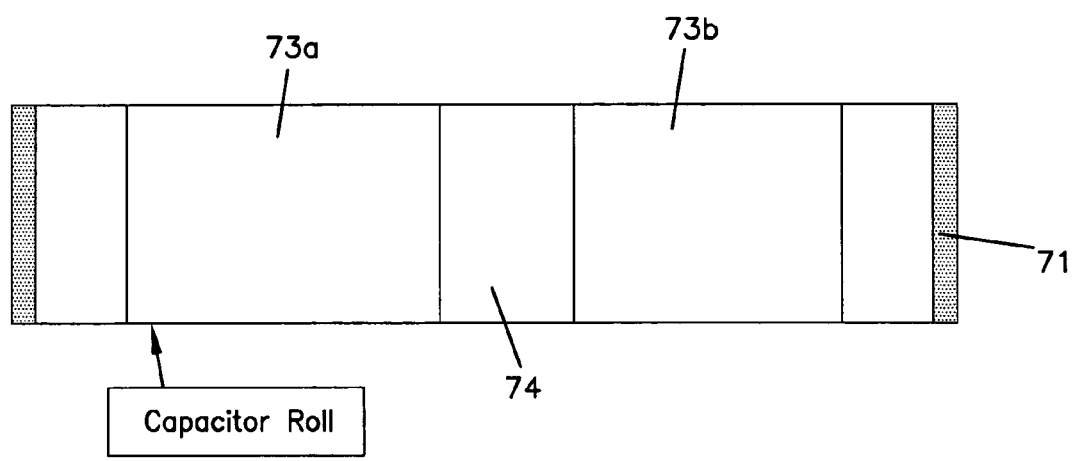
FIG. 5 is a top view of the two section metalized film capacitor of FIG. 4.

The series wound capacitors 13 and 14 are preferably devices constructed utilizing a metalized film layout. While such construction is generally known in the art, it will be described briefly herein in connection with FIGS. 4–8. First, a plain plastic film, preferably a polypropylene or polyester film, is utilized as a base for the capacitor. This film is designated at 70 in FIG. 4. A metalized area 71 is then laid on the film 70. The metal is preferably a zinc alloy or aluminum. However, other metals having the appropriate conductive properties may be employed. Examples of these metals include zinc, copper and silver. A dielectric area 72 is then placed over the metalized area 71. The dielectric is preferably polypropylene or polyester. However, other dielectrics having the appropriate dissipation and dielectric properties may be utilized. Examples of these materials include poly-phenol sulfide (PPS) and polycarbonate. A second film 74 is placed over the dielectric 72. Finally, smaller areas 73a and 73b of metal is placed over the second film 74 (also shown in FIG. 5). The smaller areas 73a and 73b comprise the upper plates of the capacitive areas of the wound capacitors. The bottom metal area 71 located adjacent the smaller areas 73a and 73b forms the bottom plate of each of the capacitive areas. The metal portion 71 between the smaller areas 73a and 73b forms the series connection between the capacitive areas. Electrical connectors are attached to the smaller areas 73a and 73b to electrically connect the wound capacitors 13 and 14 to the printed circuit board.

Figure 6:
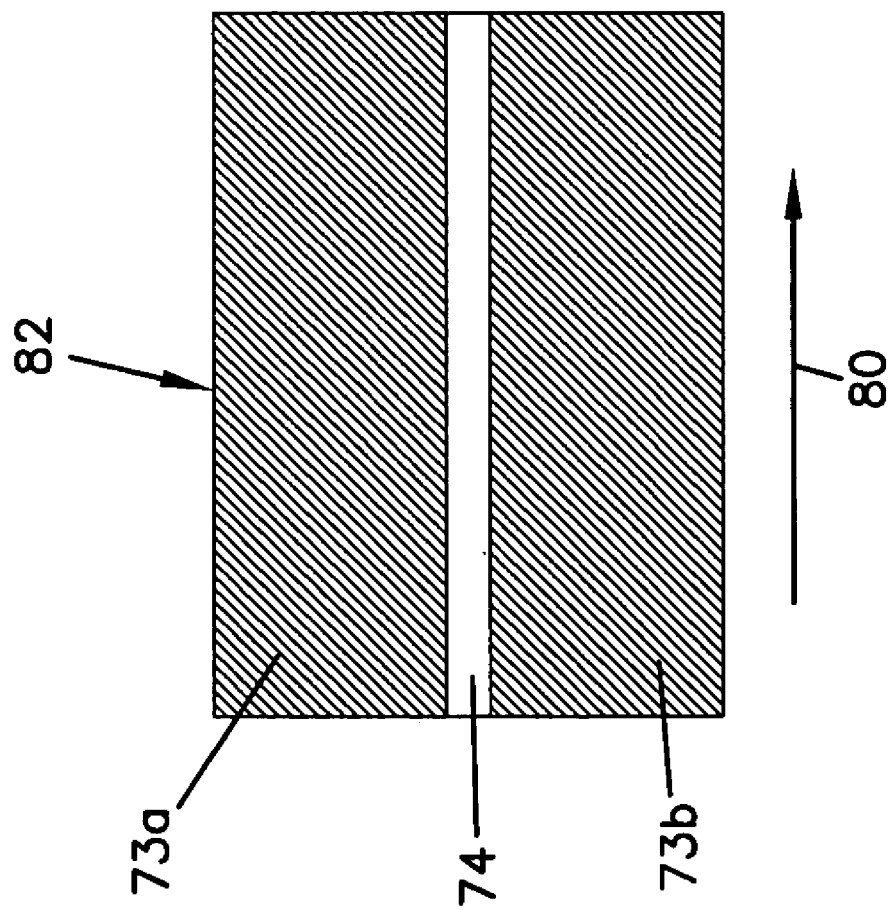
FIG. 6 is a schematic top plan view of the two conducting layers for a two section series wound capacitor.

A preferred top plan layout of a two section capacitor is shown in FIG. 6. The direction of rolling is shown by line 80. The first metalized layer 71 with film 70 is placed over the second metalized layers 73a and 73b (best seen in FIG. 8) before winding. The first metalized layer 71 is narrower than film 70, and film 70 has a smaller width than the width of the combined second layers 73a and 73b. The metalized portions of the second layers 73a and 73b extend to the edge. After the capacitor roll is formed (e.g., by rolling the first section 81 and the second section 82 together), a metal endspray is applied to the ends 85. Electrical leads can then be attached to the ends 85 for electrical connection to the printed circuit board 12.

Figure 7:
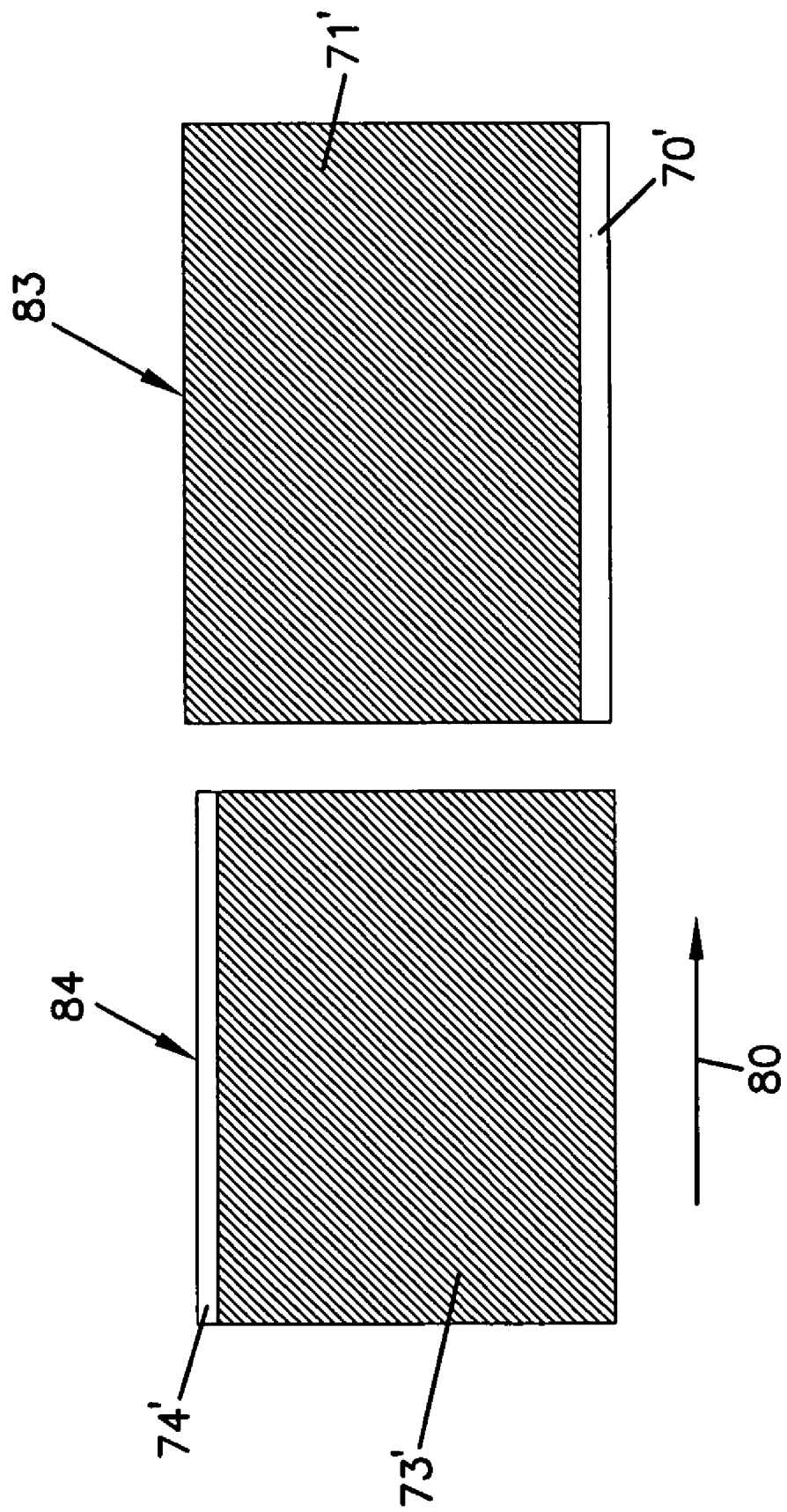
FIG. 7 is a schematic top plan view of the two conducting layers for a single section wound capacitor.
Figure 8:
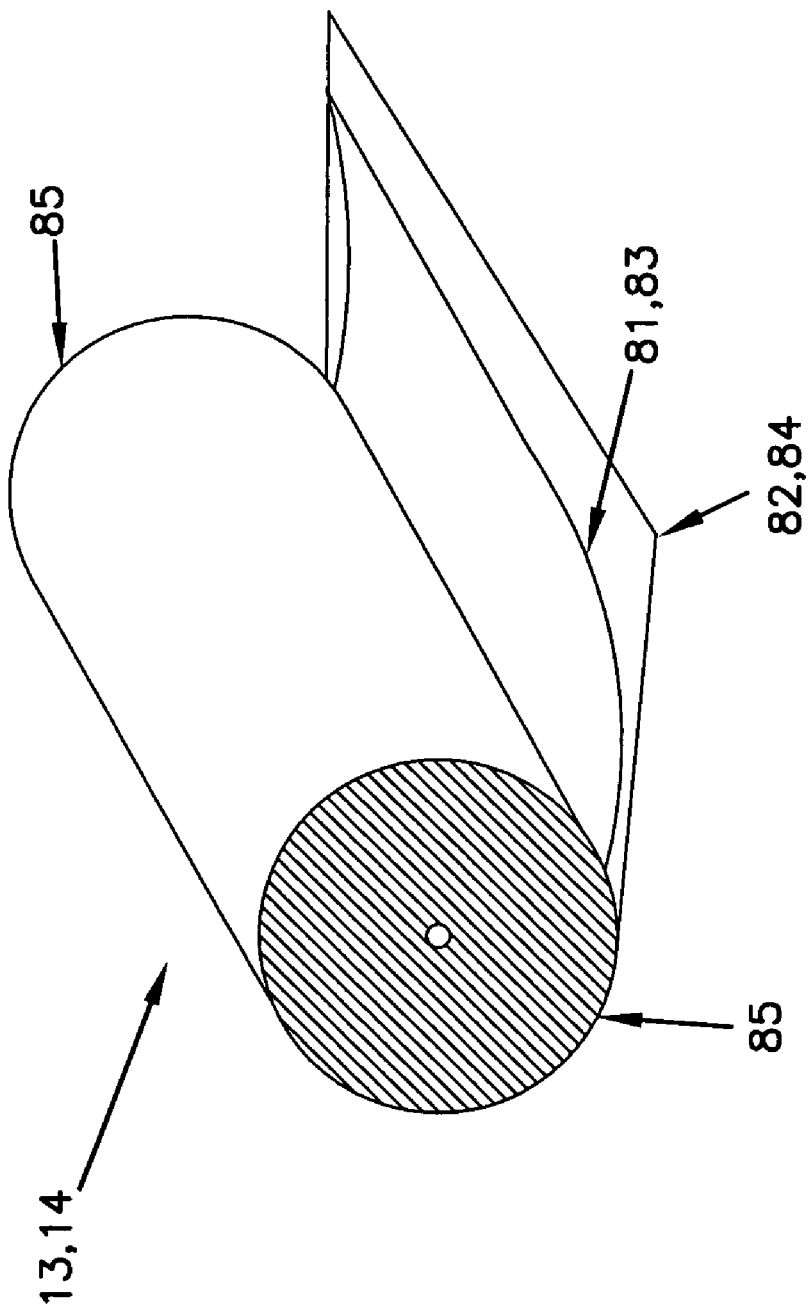
FIG. 8 is a schematic perspective view of a wound capacitor with a portion of the first and second layers unwound to illustrate the relative position of the first and second layers.

FIG. 7 is a schematic top plan view of the two conducting layers for a single section wound capacitor. First section 83 includes first metalized layer 71' on a film 70'. Second metalized layer 73' is located on film 74'. The film 74' forms a marginal edge for second section 84. The direction of rolling is indicated by the arrow designated 80. It will be appreciated from FIGS. 6 and 7 that both the single and two section capacitors include margin areas that are free of metal so when the element is rolled, a short between the plates does not occur.

It will be appreciated that the principles of this invention apply not only to high voltage fluorescent or neon sign ballasts described herein, but also to the method of forming and connecting capacitors in such systems. While particular embodiments of the invention have been described with respect to its application, it will be understood by those skilled in the art that the invention is not limited by such application or embodiment or the particular components disclosed and described herein. It will be appreciated by those skilled in the art that other components that embody the principles of this invention and other applications therefor other than as described herein can be configured within the spirit and intent of this invention. The arrangement described herein is provided as only one example of an embodiment that incorporates and practices the principles of this invention. Other modifications and alterations are well within the knowledge of those skilled in the art and are to be included within the broad scope of the appended claims.

What is claimed is:

1. A sign ballast capacitor apparatus, comprising:
   a) a first dry capacitor; and
   b) a second dry capacitor, the second dry capacitor electrically connected in series with the first dry capacitor, wherein the first and second capacitors divide the voltage across the first and second capacitors, whereby the voltage stress is lowered.

2. The apparatus of claim 1, wherein the first and second dry capacitors are connected to a printed circuit board.

3. The apparatus of claim 2, further comprising a sleeve, wherein the printed circuit is arranged and configured to be slideably inserted into the sleeve.

4. The apparatus of claim 2, further including at least one start capacitor mounted on the printed circuit board.

5. The apparatus of claim 4, wherein a first bleed resistor is connected in parallel across each of the at least one start capacitors.

6. The apparatus of claim 1, wherein the first and second dry capacitors are constructed from a metalized film.

7. The apparatus of claim 6, wherein the capacitors are wound.

8. The apparatus of claim 1, further comprising:
   a. a third dry capacitor; and
   b. a fourth dry capacitor, the third dry capacitor being electrically connected to the fourth dry capacitor in series.

9. The apparatus of claim 1, wherein the first dry capacitor is wound and includes two capacitive elements wound in series.

10. The apparatus of claim 9, wherein the second dry capacitor is wound and includes two capacitive elements wound in series.

11. The apparatus of claim 1, wherein a second bleed resistor is connected in parallel across at least one of the first and second dry capacitors.

12. A capacitor ballast assembly, comprising:
    a) a printed circuit board having a voltage input terminal and a common connection terminal;
    b) a plurality of dry capacitors connected in series with one another, wherein the plurality of dry capacitors from the power factor correction capacitance of the ballast; and
    c) wherein when a voltage is applied to the input terminal, the voltage associated with each of the plurality of dry capacitors is divided across the individual dry capacitors.

13. The assembly of claim 12, further comprising a sleeve, wherein the printed circuit board is arranged and configured to be slideably inserted into the sleeve.

14. The assembly of claim 12, wherein the plurality of dry capacitors are constructed from a metalized film.

15. The assembly of claim 14, wherein the plurality of dry capacitors are wound.

16. The assembly of claim 15, wherein at least one of the plurality of dry capacitors includes two capacitive elements wound in series.

17. The assembly of claim 15, wherein each of the plurality of dry capacitors includes two capacitive elements wound in series.

18. The assembly of claim 12, further including at least one start capacitor mounted on the printed circuit board.

19. The assembly of claim 18, wherein a bleed resistor is connected in parallel across each of the at least one start capacitors.

20. A method of forming a capacitor ballast assembly, comprising:
    a) providing a printed circuit board with a voltage input terminal and a common connection terminal;
    b) connecting a plurality of dry capacitors in series with one another, wherein the plurality of dry capacitors form the power factor correction capacitance of the ballast, wherein when a voltage is applied to the input terminal, the voltage associated with each of the plurality of dry capacitors is divided across the individual dry capacitors;
    c) inserting the plurality of dry capacitors into vinyl sleeves; and
    d) inserting the printed circuit board into a protective sleeve.

21. A sign ballast capacitor apparatus, comprising:
    a) a first dry capacitor; and
    b) a second dry capacitor, the second dry capacitor electrically connected in series with the first dry capacitor, wherein the first and second capacitors divide the voltage across the first and second capacitors, whereby the voltage stress is lowered, wherein at least one of the first and second dry capacitors includes two capacitive elements wound in series.

22. The apparatus of claim 21, wherein a bleed resistor is connected in parallel across at least one of the first and second dry capacitors.

23. The apparatus of claim 22, further comprising a sleeve, wherein the printed circuit is arranged and configured to be slideably inserted into a sleeve.

24. The apparatus of claim 21, wherein the first and second dry capacitors are connected to a printed circuit board.

25. The apparatus of claim 21, wherein the first and second dry capacitors are constructed from a metalized film.

* * * * *